US006556034B1

(12) United States Patent
Johnson et al.

(10) Patent No.: US 6,556,034 B1
(45) Date of Patent: Apr. 29, 2003

(54) HIGH SPEED AND HIGH ACCURACY DUT POWER SUPPLY WITH ACTIVE BOOST CIRCUITRY

(75) Inventors: Gerald H. Johnson, Andover, MN (US); Michael F. Taylor, Minneapolis, MN (US)

(73) Assignee: Teradyne, Inc., Boston, MA (US)

(*) Notice: Subject to any disclaimer, the term of this patent is extended or adjusted under 35 U.S.C. 154(b) by 14 days.

(21) Appl. No.: 09/718,808

(22) Filed: Nov. 22, 2000

(51) Int. Cl.$^7$ ................................................ G01R 31/26
(52) U.S. Cl. .................................... 324/765; 324/158.1
(58) Field of Search .............................. 324/73.1, 763, 324/765, 158.1; 323/275, 280, 285; 363/34, 74

(56) References Cited

U.S. PATENT DOCUMENTS

| | | | |
|---|---|---|---|
| 3,617,881 A | * 11/1971 | McCormick | 324/123 R |
| 3,670,230 A | 6/1972 | Rooney et al. | |
| 4,574,232 A | 3/1986 | Petty | |
| 4,591,962 A | 5/1986 | Schwarz et al. | 363/15 |
| 4,605,894 A | 8/1986 | Cox et al. | 324/73 |
| 4,710,861 A | 12/1987 | Kanner | |
| 4,940,929 A | 7/1990 | Williams | |
| 4,952,863 A | 8/1990 | Sartwell et al. | |
| 5,059,889 A | * 10/1991 | Heaton | 323/275 |
| 5,103,388 A | 4/1992 | Williams et al. | |
| 5,130,635 A | 7/1992 | Kase | |
| 5,686,820 A | 11/1997 | Riggio, Jr. | |
| 5,712,774 A | 1/1998 | Uramoto | |
| 5,757,203 A | 5/1998 | Brown | |
| 5,773,990 A | 6/1998 | Wilstrup et al. | |
| 5,789,933 A | 8/1998 | Brown et al. | |
| 5,789,934 A | 8/1998 | Kolkowski et al. | |
| 5,886,892 A | 3/1999 | Radley et al. | |
| 5,914,870 A | 6/1999 | Noble et al. | |
| 5,917,318 A | 6/1999 | Kamata | |
| 5,925,278 A | 7/1999 | Hirst | |
| 5,932,996 A | 8/1999 | Liepe et al. | |
| 6,046,577 A | 4/2000 | Rincon-Mora et al. | |
| 6,087,843 A | 7/2000 | Pun et al. | |

FOREIGN PATENT DOCUMENTS

DE 19741430 4/1999

OTHER PUBLICATIONS

Maxim Corp. Specification For Part No. MAX1624/MAX1625, "High–Speed Step–Down Controllers With Synchronous Rectification For CPU Power", Jun., 1997.

* cited by examiner

Primary Examiner—Kamand Cuneo
Assistant Examiner—Minh N. Tang
(74) Attorney, Agent, or Firm—Lance Kreisman

(57) ABSTRACT

A power supply is disclosed for use with a device-under-test disposed on a device board. The power supply includes a high-accuracy remote supply circuit including respective force and sense lines and a high-speed local supply circuit. The local supply circuit includes an active boost circuit having respective boost and sense lines coupled to the force and sense lines. The active boost circuit is operative to selectively cooperate with the remote supply circuit and, when the device-under-test demands a large dynamic current, provide the dynamic current until the remote supply circuit responds to the current demand.

6 Claims, 5 Drawing Sheets

HIGH SPEED AND HIGH ACCURACY DUT POWER SUPPLY WITH ACTIVE BOOST CIRCUITRY

FIELD OF THE INVENTION

The invention relates generally to automatic test equipment and more particularly a high speed and high accuracy power supply for use with a semiconductor tester to provide precise voltage levels to a high-speed device-under-test (DUT).

BACKGROUND OF THE INVENTION

Semiconductor device manufacturing typically includes test processes at both the wafer and packaged-device levels. The testing is normally carried out by automatic test equipment (ATE) that simulates a variety of operating conditions to verify the functionality of each device. As is well known in the art, semiconductor devices generally require a source of power in order to function.

Semiconductor devices such as microprocessors are designed to use minimal power when in "standby" operation, yet may consume hundreds of amperes of current when operating at maximum capability. In an ATE test environment, the current load drawn by a DUT, such as a microprocessor, can change from a few hundred milliamperes to over two hundred amperes in a few nanoseconds.

The voltage supplied to the DUT, $V_{Force}$, must generally remain within a very tight tolerance during these DUT current load changes, to ensure optimum yields during test. Due to characteristics of the DUT circuitry, changes in $V_{Force}$ during the test can affect the measured performance of the DUT. Inaccurate test results are believed to contribute to an increase in product costs by reducing the yields of acceptable devices.

Conventionally, DUT power supplies implemented in ATE are installed either in a mainframe rack, or in a test head. DC force and sense lines running between the mainframe or test head to a DUT-mounted device board provide a precisely controlled voltage $V_{Force}$ to power the DUT. While this works well for relatively lower speed devices operating at relatively low currents, high-speed devices that draw large currents over very short response times experienced a phenomena known as "droop" during maximum current demand intervals.

Generally, droop represents the drop in the voltage $V_{Force}$ supplied to the DUT following a rapid increase in current demand. Conventional ATE power supplies often lack the response time necessary to eliminate the droop associated with very high speed DUTs. Optimization of power supply accuracy and response time is a compromise. A highly accurate power supply will often have a relatively slow response time, while a power supply designed for fast response may have inadequate accuracy. In addition, the presence of inductance within the interconnections between the power supply and the DUT also produces a voltage droop at the DUT during current transients. This inductance is generally created by wafer probe needles, bond wires, package parasitics and other physical paths between the power supply and the actual die of the DUT. The ATE power supply has to overcome the impedance presented by these inductances in order to maintain $V_{Force}$ at a constant value during transient events.

The classic way to address the droop problem involves installing local bypass capacitors proximate the DUT. The capacitors store energy that can be used to compensate for droop until the power supply responds to the increased current demand. The capacitors, being closer to the DUT, have fewer parasitic inductances between them and the DUT. However, there are still some parasitic inductances remaining between these capacitors and the DUT, and these bypass capacitors can only supply current from a voltage equal to the established DUT voltage. Therefore, capacitors alone cannot eliminate the droop problem. In addition, it is difficult to place enough high quality capacitance on the device board to provide enough energy storage to adequately address the droop. Device boards typically have limited space available for these capacitors.

In ATE DUT power supply applications, high capacitances also often cause problems when, during testing, the operator or test program changes the programmed power supply voltage applied to the DUT. This might be done during ATE "schmoo" testing, where the operating margins of a DUT are determined by varying frequency and voltage parameters. Such a change generally requires a substantial amount of energy to repeatedly charge and discharge the large capacitance. These charge/discharge cycles cause ripple currents in the capacitors, which may lead to overheating and premature failure.

Two proposals that allegedly address a problem similar to the voltage droop drawbacks experienced in ATE DUT power supply applications are found in U.S. Pat. Nos. 4,710,861 to Kanner and 6,046,577 to Rincon-Mora et al. Both proposals relate to power supplies, in general, and provide circuitry operative from the DUT supply voltage to raise or lower the voltage output in response to output supply level transients.

While these proposals are believed beneficial for their intended purposes, each derives its energy from the DUT power supply voltage, much like the classic capacitor construction described above. Additionally, because the proposed schemes employ voltage output devices, performance may be subject to undesirable inductive effects. As a result, the ability to overcome inductance and properly respond at high speed is limited.

What is needed and heretofore unavailable is a high-accuracy DUT power supply capable of addressing the droop problem without the use of large capacitors. Moreover, the need exists for such a high-accuracy power supply to simultaneously support high-speed and high-current DUTs. The DUT power supply of the present invention satisfies these needs.

SUMMARY OF THE INVENTION

The DUT power supply of the present invention provides high-speed voltage and current power supply performance to devices-under-test while maintaining stringent accuracy requirements. As a result, semiconductor device manufacturers can maximize device yields and correspondingly reduce test costs.

To realize the foregoing advantages, the invention in one form comprises a power supply for use with a semiconductor tester to power a device-under-test disposed on a device board. The power supply includes a remote high-accuracy DC power supply circuit, including respective force and sense lines, and also a local high-speed AC power supply circuit. The local AC power supply circuit includes an "active boost" circuit having respective boost and sense lines coupled to the force and sense lines. The AC power supply boost circuit is operative to cooperate with the remote DC power supply circuit and, when the deviceunder-test demands a large dynamic current, provides the dynamic current until the remote DC power supply circuit responds to the current demand.

In another form, the invention comprises automatic test equipment for testing a device-under-test. The automatic test equipment includes a computer workstation and a test head coupled to the computer workstation. The test equipment further includes a device-under-test power supply including a high-accuracy DC power supply circuit having respective force and sense lines, and a high-speed AC power supply boost circuit. The AC power supply boost circuit has an active boost circuit including respective boost and sense lines coupled to the force and sense lines. The AC power supply boost circuit is operative to cooperate with the DC power supply circuit and, when the device-under-test demands a large dynamic current, provide the dynamic current until the DC power supply circuit responds to the current demand.

In yet another form the invention comprises a method of accurately supplying power to a high-speed device-under-test. The method includes the steps of forcing a DC current to the device-under-test along a DC force line at high accuracy from a DC power supply circuit having a predetermined response time; and boosting current from an active AC power supply boost circuit when current demand from the device-under-test changes faster than the predetermined DC power supply circuit response time.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
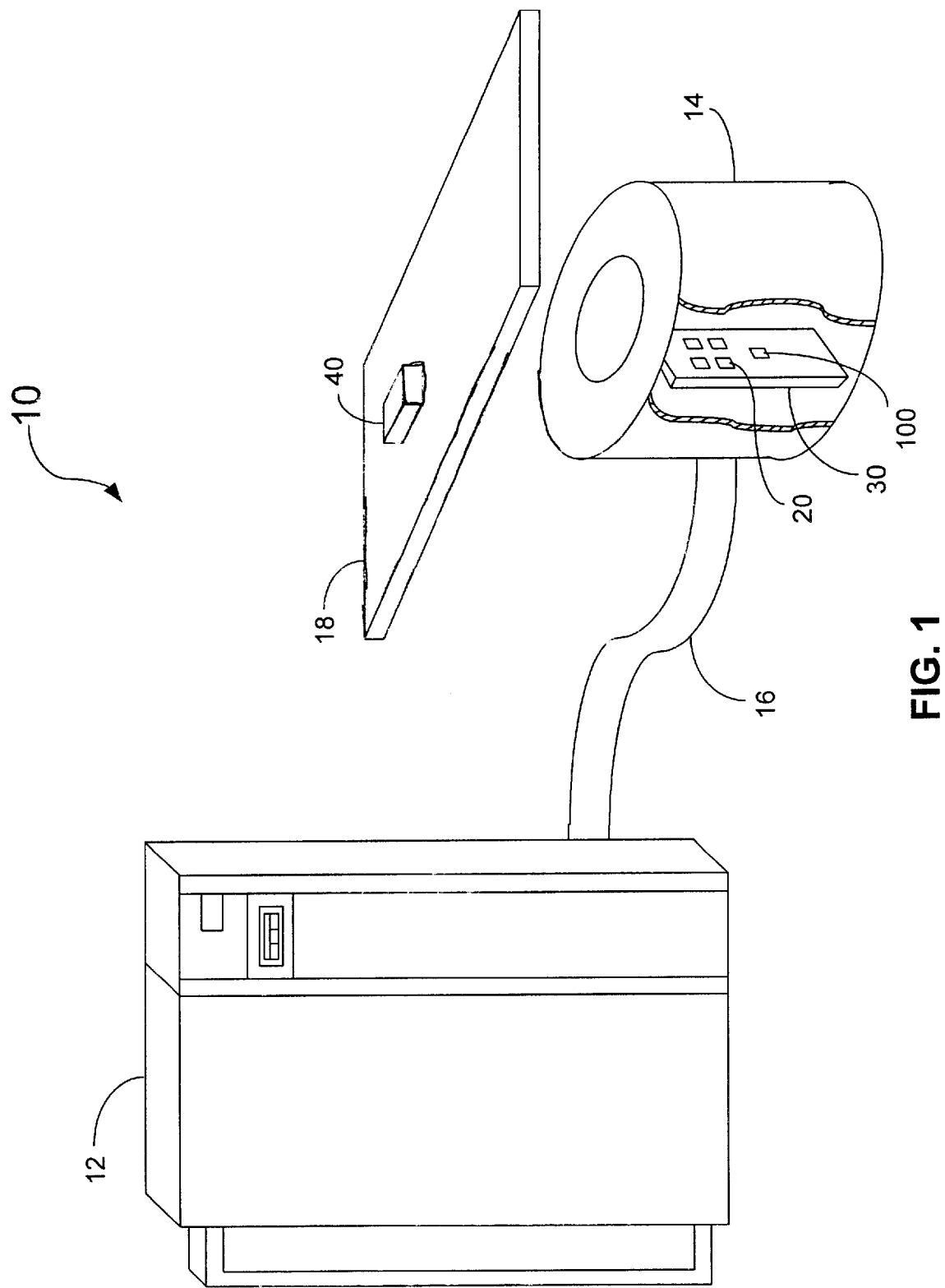
FIG. 1 is a block diagram of a semiconductor tester according to one form of the present invention.

Referring now to FIG. 1, the device-under-test (DUT) power supply of the present invention, generally designated 30, is adaptable for use by automatic test equipment, generally designated 110. The power supply implements DC power supply circuitry 20 and AC power supply boost circuitry 100 in the form of a boost circuit to address the dynamic current needs of a high-speed and high-current DUT 40. By separating the power supply circuitry into respective AC power supply and DC power supply circuits, high-speed response to dynamic current demands is possible without sacrificing high accuracy.

Further referring to FIG. 1, the automatic test equipment, or ATE, 10 generally includes a computer workstation 12 that couples to a test head 14 via a cable bundle 16. The test head houses a plurality of channel cards (not shown) and power supply boards 30 (only one board shown) in relative close proximity to the DUT 40. The DUT mounts to a device-interface-board (DIB) 18, that interfaces with the test head via a tester interface (not shown). The tester interface provides an interconnection of signal, ground and power paths between the ATE and the DUT.

Figure 2:
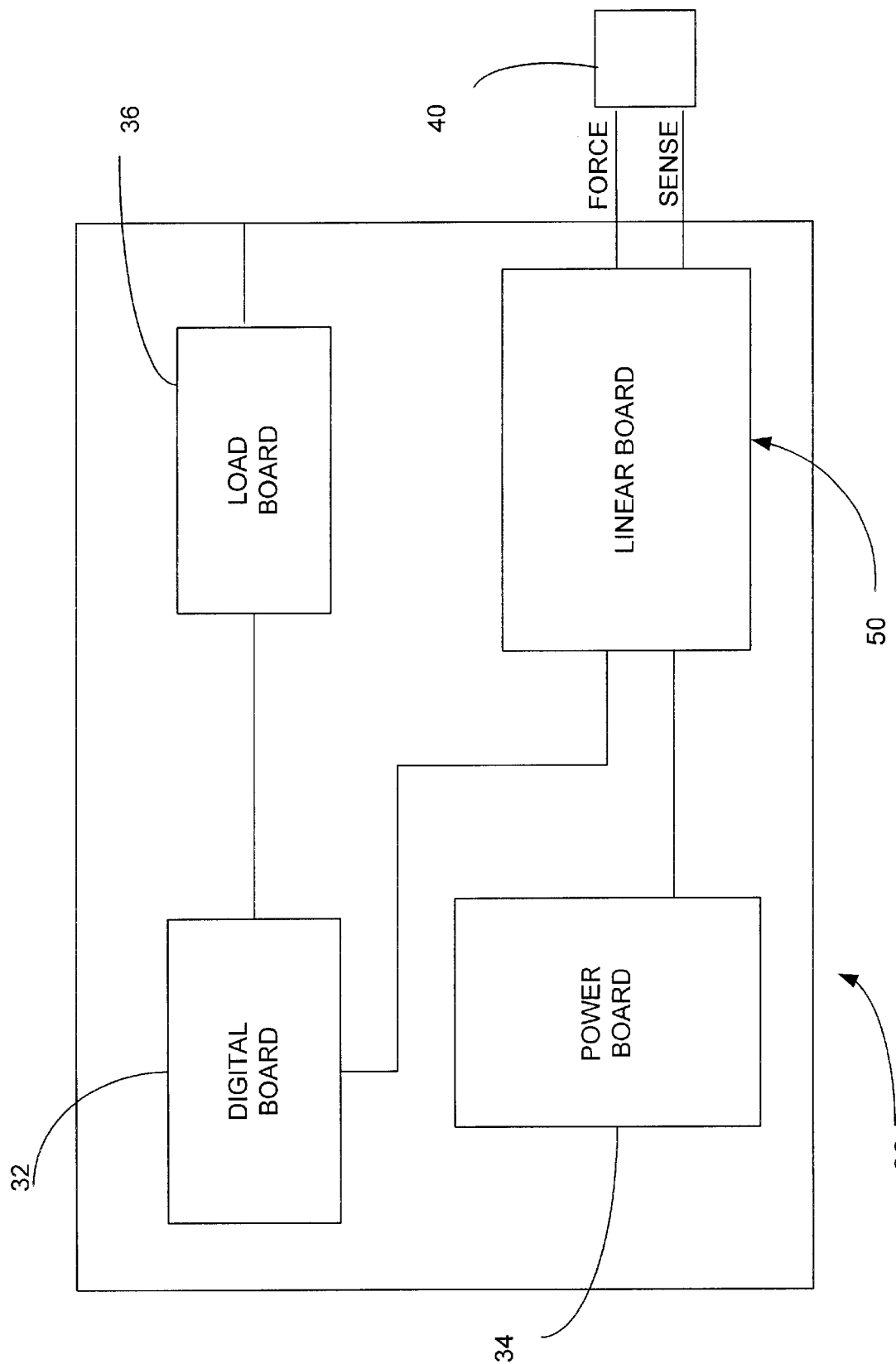
FIG. 2 is a block diagram of a DUT power supply according to one form of the present invention.

With reference to FIG. 2, the DUT power supply 30 that employs the boost circuit of the present invention includes a digital board 32, a power board 34, a load board 36 and a linear amplifier board 50. This unique overall architecture, including the load board construction, is more fully described in co-pending U.S. application Ser. No. 09/943,275, titled Method and Apparatus For Calibration and Validation of High Performance DUT Power Supplies, filed Aug. 30, 2001, assigned to the assignee of the present invention, and expressly incorporated herein by reference. The power board takes the form of a low-noise switching DC-DC converter, as more fully set forth in co-pending U.S. Application Serial No. 09/718,780, titled Switching DC-DC Converter with Noise Suppression Circuitry, filed Nov. 22, 2000, assigned to the assignee of the present invention, and expressly incorporated herein by reference. The digital board 32 provides a digital-to-analog control interface between the tester and the DUT power supply.

Figure 3:
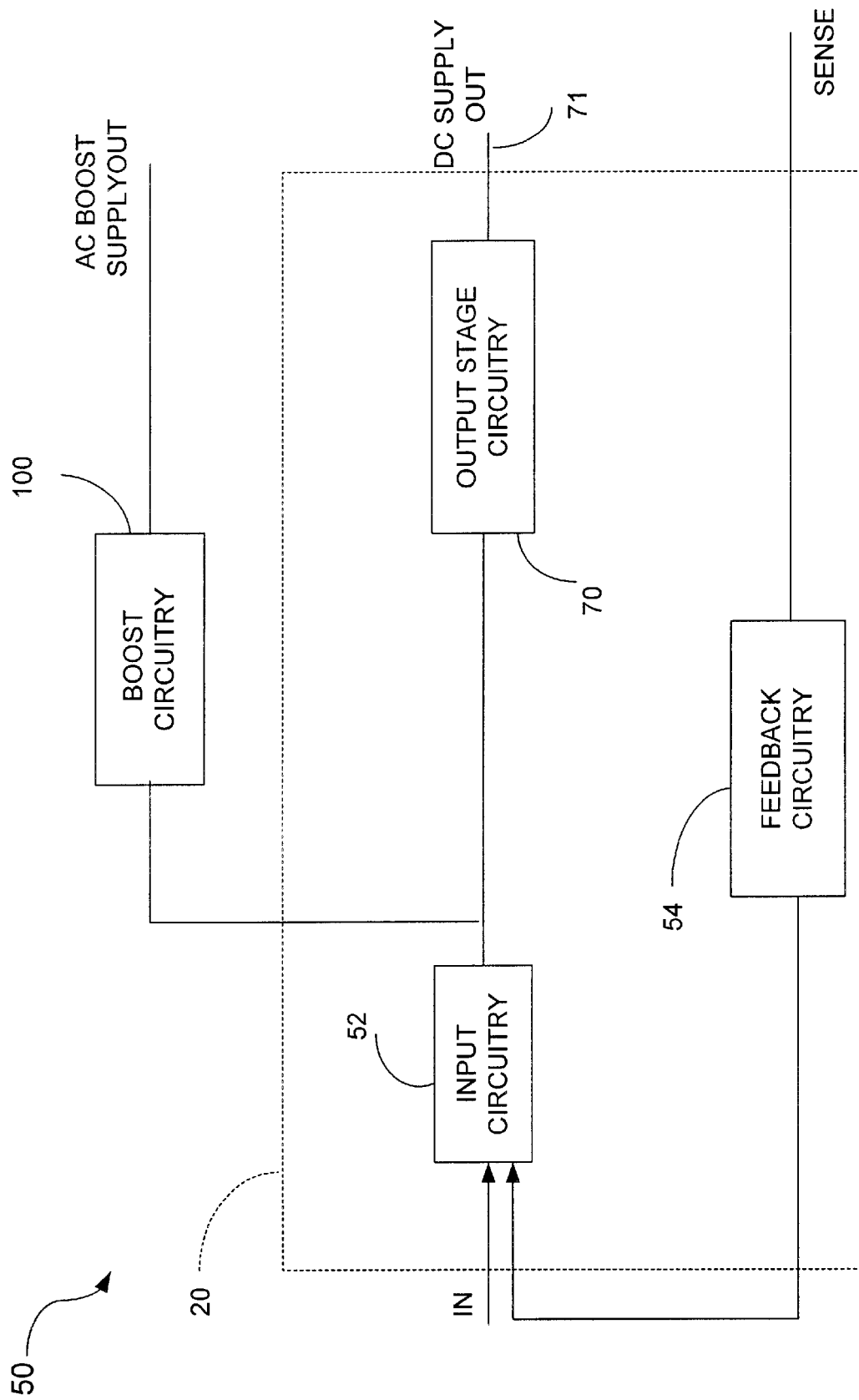
FIG. 3 is a block diagram of the DC power supply and the AC power supply.
Figure 4:
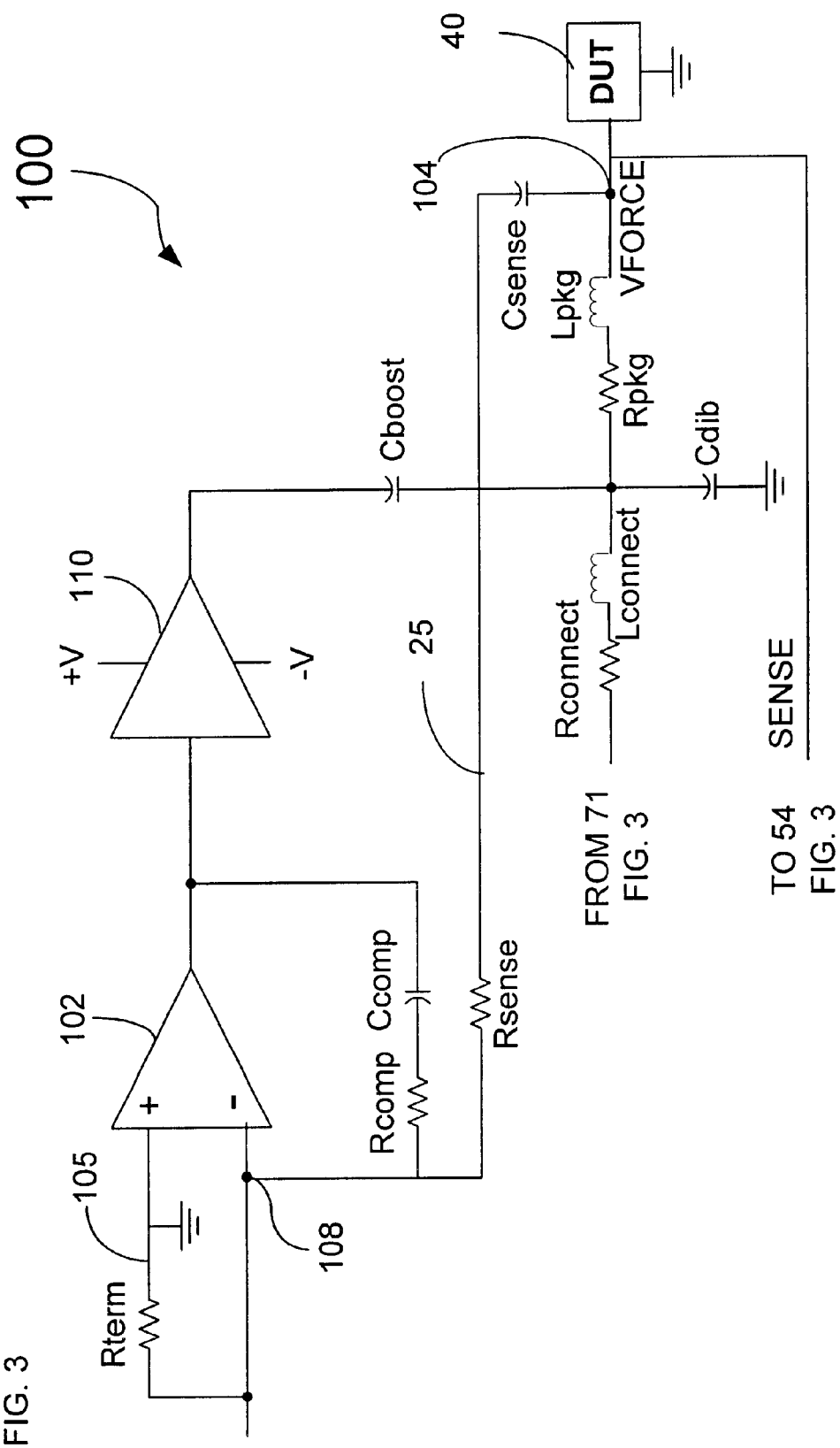
FIG. 4 is a block diagram of one embodiment of the AC power supply boost circuit of FIG. 3.

With reference to FIG. 3, the linear amplifier board 50 includes DC power supply circuitry 20 and AC power supply circuitry defining a boost circuit 100. Output stage circuitry 70 couples to the DC supply OUT 71 to provide a highly accurate DC power supply voltage that, in combination with the AC coupled boost circuit 100, also supports high speed operation. The DC power supply circuitry 20 generally includes input circuitry 52 that receives a programmed DC voltage from the computer workstation 12 (FIG. 1), and an error signal from feedback circuitry 54. The feedback circuitry 54 monitors the DC power supply output at the DUT 40 (FIG. 4) by means of SENSE line 54. The input circuitry 52 feeds a command signal to output stage circuitry 70 to properly source or sink current depending on the requirements of the DUT 40 (FIG. 4). Further details of the linear amplifier board 50 are found in co-pending U.S. Pat. No. 6,448,748, titled "High Current and High Accuracy Linear Amplifier" assigned to the assignee of the present invention, and expressly incorporated herein by reference.

Referring now to FIG. 4, the AC power supply boost circuit 100 is AC coupled to the DUT 40. This current is supplied through a capacitor Cboost so that the accuracy of the DC power supply is not affected by the AC power supply boost circuitry. The high-speed response of the AC power supply boost circuitry compensates for the relatively slower response of the high accuracy DC power supply circuit.

With further reference to FIG. 4, the AC power supply boost circuitry includes an error amplifier 102 having its inverting input 108 coupled to a DC sense node 104 via a sense path 25 including a sense resistor Rsense coupled in series with a sense capacitor Csense. The noninverting input 105 of the error amplifier is grounded, in effect virtually grounding the inverting input at 108. The output of the error amplifier 102 feeds a voltage controlled current source 110 that provides a highly responsive current "boost" to a DC force line 71 (FIG. 3) through capacitor Cboost. The voltage controlled current source 110 is bipolar, and can both source and sink current. Sourcing current is required during periods of increasing DUT current, while sinking of current is required during periods of decreasing DUT current. The AC power supply boost circuitry 100 is preferably disposed as an integrated circuit on the power supply board 30 (FIG. 1), but may be installed proximate the DUT 40 on the DIB 18 (FIG. 1) to minimize inductance and resistance between the DIB and the DUT.

For optimal accuracy and performance, the AC power supply boost circuitry 100 optionally implements prediction or anticipate circuitry (not shown) that feeds input signals to the boost circuit input. The anticipate circuitry generally includes a memory or look-up table (not shown) in the DC power supply circuitry 20 that stores deterministic current load patterns associated with the DUT 40. The anticipate circuitry also pre-drives the voltage-controlled current source 110 to compensate for any expected delay on the part of the AC power supply boost circuitry 100.

Referring now to FIG. 3, in operation, the DC power supply circuitry 20 provides a highly accurate DC voltage level $V_{Force}$ to the DUT 40 (FIG. 4) along the DC Supply OUT line 71 according to rigorous semiconductor manufacturing specifications. For example, the accuracy of the DC circuitry under DC conditions meets tolerances in the range of around +/−1 to 3 mV, at current loads from a device operating at gigahertz frequencies and drawing up to 200 A. The voltage at the DUT 40 (FIG. 4) is detected and fed back to the DC power supply circuitry 20 via the DC sense line SENSE 54 for monitor and control purposes.

Referring to FIG. 4, as the DUT 40 responds to test patterns supplied by the semiconductor tester on its I/O pins (not shown), the current consumption may rise dramatically over the course of a few nanoseconds. In order to respond to such dynamic current needs, local DIB capacitance Cdib provides a brief but highly responsive current boost, followed by additional current provided by larger capacitors (not shown) stored on the power supply board. As the current flow begins to create a drop in the voltage $V_{Force}$ supplied to the DUT (droop), the AC power supply sense line 25 detects the condition across the sense resistor Rsense and sets the AC power supply boost circuitry 100 into operation.

Further referring to FIG. 4, when the drop in voltage across the resistor Rsense is detected, an imbalance is created between the inputs of the error amplifier 102, causing it to generate an error signal proportional to the imbalance. The resulting error signal drives the current source 110 to generate an output signal which is connected to the output of the OUTPUT STAGE CIRCUITRY 70. Because the AC power supply boost circuitry is designed for speed rather than precision, the response time from when the droop in $V_{Force}$ at the DUT is first detected, to when the current arrives to supplement the droop is very short. Because the AC power supply boost circuitry source voltage is higher than that of the capacitors, interconnect inductance can be more readily overcome, thereby improving accuracy and performance. The response time of the AC power supply boost circuitry 100 is slower than the response time of the DIB capacitance Cdib, but faster than the response time of the DC supply 20 (FIG. 3). Since both the capacitor Cdib and the AC power supply boost circuitry are within the control loop of the DC power supply, the response of these three sources can be designed to provide a very fast responding supply of current that still has all the DC accuracy of the DC power supply alone.

As noted above, for a deterministic pattern of test vectors applied to a DUT it is possible to learn the required current versus time and use that knowledge to predict the current consumption of the DUT 40 in response to test patterns applied by the tester 10. Knowing this data allows the anticipate circuitry to pre-drive the local power supply circuitry 30 so that the response time approaches an almost imperceptible delay.

Figure 5:
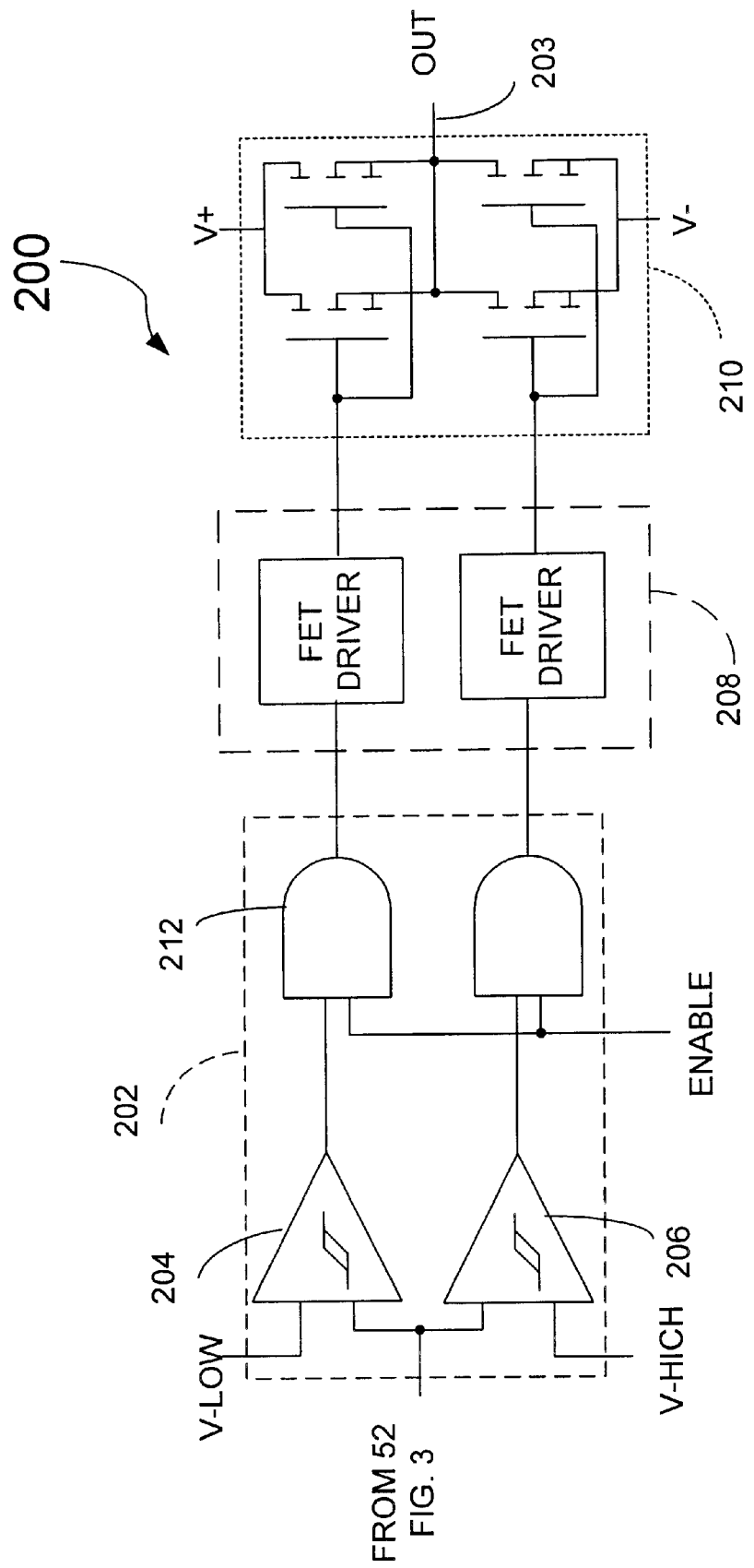
FIG. 5 is a block diagram of an alternative embodiment of the AC power supply boost circuit of FIG. 3.

Referring now to FIG. 5, in an alternative embodiment, the AC power supply boost circuitry implements a switching converter scheme, generally designated 200, that utilizes fewer components and dissipates less power than the previously described embodiment.

The switching converter AC power supply boost circuit 200 includes a window comparator circuit 202 comprising respective low and high comparators 204 and 206 that receive an error signal from the DC power supply input circuitry 52 (FIG. 3) for comparison to the two precision reference voltages V-LOW and V-HIGH that set the window compare limits. FET driver circuitry 208 is disposed at the output of the window comparator circuit, and is operative to drive one side of a group of paralleled low on-resistance FETs 210. These FETs connect the output to either the positive voltage supply to source current to the output OUT 203, or to the negative voltage supply to sink current from the output OUT 203. Unlike the linear version of the AC power supply boost circuit 100 (FIG. 4), this switching version 200 is not AC coupled to the DC supply at the input side or the output side by capacitors Csense or Cboost (FIG. 4). The AC power supply output stage 210 preferably comprises respective source and sink FETs coupled in parallel to the output DC Supply OUT 71 of the DC power supply circuit (FIG. 3).

In operation, the error signal from the input circuitry 52 (FIG. 3) is presented to the inputs of window comparators 204 and 206, and is compared to the precision voltages V-LOW and V-HIGH by the window comparator circuit 202. If the error signal is between the two limits V-LOW and V-HIGH of the comparators, then no output FETs 210 are turned on and the switching AC power supply circuit 200 has a high input impedance and a high output impedance. This high input and output impedance allows the AC power supply circuit to be DC coupled to the DC-power supply, and still not reduce the accuracy of the DC power supply during periods when the load current is not changing. If the error signal is outside the low limit V-LOW of the low comparator 204, then the comparator output goes high. If the error signal is outside the high limit V-HIGH of the high comparator 206, then that comparator output goes high. The high output is fed through an AND gate 212 to drive the FET driver circuit 208. The FET driver translates levels and provides enough current to quickly turn on the current source/sink 210. The current source/sink is turned on "hard", so it will deliver or draw current to/from the supply rail to the output OUT 203.

For example, when the DUT demands more current, the voltage at the load will droop, creating a negative error signal to activate the source FET. This FET provides very high current to rapidly pull the voltage $V_{Force}$ back up. However, after the voltage $V_{Force}$ rises above the comparator set-point (plus the comparator hysteresis), the FET is no longer driven. However, the load will once again cause the voltage to droop. This cycle repeats itself in a relaxation oscillator fashion. Since the average voltage is still below the desired $V_{Force}$, there is still an error signal to the DC power supply 20 (FIG. 3).

After several cycles of AC power supply boost circuit operation, the high accuracy DC power supply circuitry is able to respond to the current change at the DUT and produce enough current to bring the voltage above the window comparator trip point for an extended duration. At that point, the AC power supply boost circuit FET 210 remains off. Operation of the FETs is in a saturated switched mode so that they have very low on resistance during conduction. This minimizes the power dissipation in the output FETs.

Those skilled in the art will appreciate the numerous benefits and advantages afforded by the present invention.

Of particular importance is the avoidance of very large values of device-board capacitance by implementing active circuitry to compensate for voltage droop during dynamic current loads. This also provides a benefit by reducing energy storage requirements, and correspondingly minimizing the potential for capacitor overheating due to large ripple currents. A further feature of the present invention is the ability to anticipate and compensate for dynamic current changes in the DUT, reducing response times to very low levels. Another feature of the present invention is that the active current source can supply energy from a higher voltage source than is present on the DIB capacitance. This allows the circuitry to quickly compensate for voltage drops across inductance between the capacitance and the DUT.

While the invention has been particularly shown and described with reference to the preferred embodiments thereof, it will be understood by those skilled in the art that various changes in form and detail may be made therein without departing from the spirit and scope of the invention. For example, while the present invention has been described in detail for use in packaged-device level applications, minor modifications could be made to employ the power supply in wafer-probe applications. In such applications, device boards take the form of probecards.

Additionally, it should be understood that while the AC power supply boost circuitry is described as mounted directly to the DIB, the circuitry may encompass a module that could be selectively plugged into the DIB. The AC power supply boost circuitry can alternately be incorporated on the same board in the test head as is the high-accuracy DC power supply. Since the AC power supply boost circuitry may operate from a source voltage higher than $V_{Force}$, it can overcome the interconnect inductance impedance while operating at some distance from the DUT.

What is claimed is:

1. A power supply for use with a semiconductor tester to power a device-under-test, said device under test disposed on a device board, said power supply including:

a high-accuracy DC supply circuit including respective force and sense lines, the DC supply circuit having a predetermined DC response time; and a high-speed AC supply circuit including an active boost circuit having respective boost and sense lines coupled to said force and sense lines, said active boost circuit operative to selectively cooperate with the high-accuracy DC supply circuit and, when said device-under-test demands a large dynamic current, provide said dynamic current until the DC supply circuit responds according to the predetermined DC response time.

2. A power supply according to claim 1 wherein:

said high accuracy DC power supply circuit and said high-speed AC supply circuit reside in a semiconductor tester test head.

3. A power supply according to claim 1 wherein:

said high-speed AC power supply circuit resides proximate said device board.

4. A power supply according to claim 1 wherein:

said high-speed AC power supply circuit comprises an integrated circuit.

5. A method of accurately supplying power to a high-speed device-under-test, said method including the steps of:

forcing a DC current to said device-under-test along a DC force line at high accuracy from a DC supply circuit having a predetermined DC supply circuit response time; and boosting current from an active AC supply circuit when current demand from said device-under-test changes faster than said predetermined DC supply circuit response time.

6. A method according to claim 5 wherein said step of forcing comprises the step of remotely forcing, and said step of boosting comprises the step of locally boosting.

* * * * *